US011825658B2

(12) United States Patent
Parekh

(10) Patent No.: US 11,825,658 B2
(45) Date of Patent: Nov. 21, 2023

(54) METHODS OF FORMING MICROELECTRONIC DEVICES AND MEMORY DEVICES

(71) Applicant: Micron Technology, Inc., Boise, ID (US)

(72) Inventor: Kunal R. Parekh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 232 days.

(21) Appl. No.: 17/000,809

(22) Filed: Aug. 24, 2020

(65) Prior Publication Data

US 2022/0059560 A1   Feb. 24, 2022

(51) Int. Cl.
*H10B 43/40* (2023.01)
*H10B 41/27* (2023.01)
(Continued)

(52) U.S. Cl.
CPC ......... *H10B 43/40* (2023.02); *H01L 23/5226* (2013.01); *H01L 23/53228* (2013.01);
(Continued)

(58) Field of Classification Search
CPC ......... H01L 27/11573; H01L 27/11524; H01L 27/11529; H01L 27/11556; H01L 27/1157;
(Continued)

(56) References Cited

U.S. PATENT DOCUMENTS

| 4,925,809 A | 5/1990 | Yoshiharu et al. |
| 6,165,247 A | 12/2000 | Kodas et al. |

(Continued)

FOREIGN PATENT DOCUMENTS

| CN | 107768376 A | 3/2018 |
| CN | 107887395 A | 4/2018 |

(Continued)

OTHER PUBLICATIONS

Micron, Introducing 2nd Generation Micron Mobile TLC 3D NAND, Industry-Leading Storage Solutions for Flagship Smartphones, (2018), 9 pages.

(Continued)

*Primary Examiner* — Phat X Cao
(74) *Attorney, Agent, or Firm* — TraskBritt

(57) ABSTRACT

A method of forming a microelectronic device comprises forming a microelectronic device structure. The microelectronic device structure comprises a semiconductive base structure, and a memory array region vertically overlying the semiconductive base structure and comprising memory cells. The microelectronic device structure is attached to a base structure. A portion of the semiconductive base structure is removed after attaching the microelectronic device structure to a base structure. A control logic region is formed vertically over a remaining portion of the semiconductive base structure. The control logic region comprises control logic devices in electrical communication with the memory cells of the memory array region. Microelectronic devices, memory devices, electronic systems, and additional methods are also described.

13 Claims, 5 Drawing Sheets

(51) Int. Cl.
  *H10B 41/35* (2023.01)
  *H10B 41/41* (2023.01)
  *H10B 43/27* (2023.01)
  *H10B 43/35* (2023.01)
  *H01L 23/00* (2006.01)
  *H01L 23/532* (2006.01)
  *H01L 23/522* (2006.01)

(52) U.S. Cl.
  CPC ............. *H01L 24/05* (2013.01); *H10B 41/27* (2023.02); *H10B 41/35* (2023.02); *H10B 41/41* (2023.02); *H10B 43/27* (2023.02); *H10B 43/35* (2023.02); *H01L 2224/05025* (2013.01); *H01L 2224/05124* (2013.01)

(58) Field of Classification Search
  CPC ... H01L 27/11582; H10B 43/40; H10B 41/27; H10B 41/35; H10B 41/41; H10B 43/27; H10B 43/35
  See application file for complete search history.

(56) References Cited

U.S. PATENT DOCUMENTS

| | | | |
|---|---|---|---|
| 7,372,091 B2 | 5/2008 | Leslie | |
| 7,897,485 B2 | 3/2011 | Parekh | |
| 8,042,082 B2 | 10/2011 | Solomon | |
| 8,958,228 B2 | 2/2015 | Samachisa et al. | |
| 9,196,753 B2 | 11/2015 | Ramaswamy et al. | |
| 9,397,145 B1 | 7/2016 | Sills et al. | |
| 9,449,652 B2 | 9/2016 | Juengling | |
| 9,515,083 B2 | 12/2016 | Lee et al. | |
| 9,530,790 B1 | 12/2016 | Lu et al. | |
| 9,553,263 B1 | 1/2017 | Petz et al. | |
| 9,590,012 B2 | 3/2017 | Lee et al. | |
| 9,653,617 B2 | 5/2017 | Zhou et al. | |
| 9,893,207 B1 | 2/2018 | Balakrishnan et al. | |
| 9,922,716 B2 | 3/2018 | Hsiung | |
| 10,141,330 B1 | 11/2018 | Lindsay et al. | |
| 10,283,703 B2 | 5/2019 | Pellizzer et al. | |
| 10,381,362 B1 | 8/2019 | Cui et al. | |
| 10,665,580 B1 | 5/2020 | Hosoda et al. | |
| 10,847,220 B2 | 11/2020 | Castro | |
| 11,282,815 B2 | 3/2022 | Parekh et al. | |
| 11,335,602 B2 | 5/2022 | Parekh | |
| 11,380,669 B2 | 7/2022 | Parekh | |
| 11,545,456 B2 | 1/2023 | Goda et al. | |
| 11,557,569 B2 | 1/2023 | Parekh | |
| 11,563,018 B2 | 1/2023 | Parekh | |
| 2003/0113669 A1 | 6/2003 | Cheng et al. | |
| 2003/0151083 A1 | 8/2003 | Matsui et al. | |
| 2005/0265076 A1 | 12/2005 | Forbes | |
| 2006/0076690 A1 | 4/2006 | Khandros et al. | |
| 2007/0288702 A1 | 12/2007 | Roohparvar | |
| 2008/0019165 A1 | 1/2008 | Lin et al. | |
| 2009/0168482 A1 | 7/2009 | Park et al. | |
| 2011/0159645 A1 | 6/2011 | Pekny | |
| 2011/0309431 A1* | 12/2011 | Kidoh | H01L 29/66833 257/E21.409 |
| 2012/0047321 A1 | 2/2012 | Yoon et al. | |
| 2012/0161094 A1 | 6/2012 | Huo et al. | |
| 2012/0181602 A1* | 7/2012 | Fukuzumi | H01L 27/11582 257/326 |
| 2012/0224426 A1 | 9/2012 | Nam et al. | |
| 2013/0126622 A1 | 5/2013 | Finn | |
| 2013/0130468 A1 | 5/2013 | Higashitani et al. | |
| 2014/0001583 A1 | 1/2014 | Teh et al. | |
| 2014/0061750 A1* | 3/2014 | Kwon | H01L 27/11531 257/314 |
| 2014/0063938 A1 | 3/2014 | Oh et al. | |
| 2014/0124726 A1 | 5/2014 | Oh | |
| 2014/0175637 A1 | 6/2014 | Stuber et al. | |
| 2014/0204675 A1 | 7/2014 | Cho et al. | |
| 2015/0091180 A1 | 4/2015 | Ong et al. | |
| 2015/0243708 A1 | 8/2015 | Ravasio et al. | |
| 2015/0278675 A1 | 10/2015 | Finn et al. | |
| 2016/0049201 A1 | 2/2016 | Lue et al. | |
| 2016/0079164 A1 | 3/2016 | Fukuzumi et al. | |
| 2016/0104715 A1 | 4/2016 | Pachamuthu et al. | |
| 2016/0268304 A1 | 9/2016 | Ikeda et al. | |
| 2016/0343727 A1 | 11/2016 | Kim et al. | |
| 2017/0025421 A1 | 1/2017 | Sakakibara et al. | |
| 2017/0054036 A1 | 2/2017 | Dorhout et al. | |
| 2017/0092649 A1 | 3/2017 | Takaoka | |
| 2017/0148802 A1 | 5/2017 | Dorhout et al. | |
| 2018/0053768 A1 | 2/2018 | Kim et al. | |
| 2018/0108741 A1 | 4/2018 | Li et al. | |
| 2018/0158689 A1 | 6/2018 | Mumford | |
| 2018/0269329 A1 | 9/2018 | Balakrishnan et al. | |
| 2018/0358476 A1 | 12/2018 | Balakrishnan et al. | |
| 2019/0043836 A1 | 2/2019 | Fastow et al. | |
| 2019/0088493 A1 | 3/2019 | Watanabe et al. | |
| 2019/0096906 A1 | 3/2019 | Lindsay et al. | |
| 2019/0206861 A1 | 7/2019 | Beigel et al. | |
| 2019/0221557 A1 | 7/2019 | Kim et al. | |
| 2019/0229089 A1 | 7/2019 | Zhou et al. | |
| 2019/0355786 A1 | 11/2019 | Iguchi | |
| 2020/0006380 A1 | 1/2020 | Van et al. | |
| 2020/0013792 A1 | 1/2020 | Parekh et al. | |
| 2020/0013798 A1 | 1/2020 | Parekh | |
| 2020/0066745 A1 | 2/2020 | Yu et al. | |
| 2020/0083245 A1 | 3/2020 | Fayrushin et al. | |
| 2020/0098776 A1* | 3/2020 | Sugisaki | H01L 27/11582 |
| 2020/0135541 A1 | 4/2020 | Wu et al. | |
| 2020/0159133 A1 | 5/2020 | Yan et al. | |
| 2020/0161295 A1 | 5/2020 | Sills et al. | |
| 2020/0185406 A1 | 6/2020 | Li et al. | |
| 2020/0219815 A1 | 7/2020 | Elsherbini et al. | |
| 2020/0227397 A1* | 7/2020 | Yada | H01L 27/11565 |
| 2020/0258816 A1 | 8/2020 | Okina et al. | |
| 2020/0258876 A1 | 8/2020 | Hosoda et al. | |
| 2020/0258904 A1 | 8/2020 | Kai et al. | |
| 2020/0273840 A1 | 8/2020 | Elsherbini et al. | |
| 2021/0074711 A1 | 3/2021 | Suzuki et al. | |
| 2021/0082939 A1 | 3/2021 | Matsuda | |
| 2021/0134778 A1 | 5/2021 | Huang et al. | |
| 2021/0296316 A1 | 9/2021 | Zhu | |
| 2021/0343690 A1 | 11/2021 | Salmon | |
| 2021/0398847 A1 | 12/2021 | Parekh | |
| 2021/0398897 A1 | 12/2021 | Parekh | |
| 2022/0020736 A1 | 1/2022 | Yip et al. | |
| 2022/0028830 A1 | 1/2022 | Kirby | |
| 2022/0238631 A1 | 7/2022 | Zierak et al. | |
| 2022/0336646 A1 | 10/2022 | Ontalus et al. | |
| 2022/0416029 A1 | 12/2022 | Ontalus | |
| 2023/0301191 A1 | 9/2023 | Ferrari et al. | |

FOREIGN PATENT DOCUMENTS

| | | |
|---|---|---|
| CN | 108447865 A | 8/2018 |
| CN | 111247636 A | 6/2020 |
| JP | 2002-103299 A | 4/2002 |
| KR | 10-2009-0034570 A | 4/2009 |
| KR | 10-2014-0117062 A | 10/2014 |
| KR | 10-2015-0085155 A | 7/2015 |
| KR | 10-2020-0008606 A | 1/2020 |
| KR | 10-2020-0037444 A | 4/2020 |
| TW | 201511319 A | 3/2015 |
| TW | 201826556 A | 7/2018 |
| TW | 201941407 B | 10/2019 |
| TW | 201946057 A | 12/2019 |
| TW | 202008568 B | 2/2020 |
| WO | 2008/063251 A2 | 5/2008 |
| WO | 2019/182657 A1 | 9/2019 |

OTHER PUBLICATIONS

International Search Report for Application No. PCT/US2021/044726, dated Nov. 25, 2021, 3 pages.
Written Opinion of the International Searching Authority for Application No. PCT/US2021/044726, dated Nov. 25, 2021, 4 pages.

(56) References Cited

OTHER PUBLICATIONS

Choe, Jeongdong, YMTC is China's First Mass Producer of 3D NAND Flash Memory Chips, https://www.techinsights.com/blog/ymtc-chinas-first-mass-producer-3d-nand-flash-memory-chips, Mar. 12, 2020.
Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.
YMTC, About Xtacking, http://www.ymtc.com, visited Apr. 20, 2020.

\* cited by examiner

METHODS OF FORMING MICROELECTRONIC DEVICES AND MEMORY DEVICES

TECHNICAL FIELD

The disclosure, in various embodiments, relates generally to the field of microelectronic device design and fabrication. More specifically, the disclosure relates to methods of forming microelectronic devices and memory devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the memory device.

DETAILED DESCRIPTION

Figure 1A:
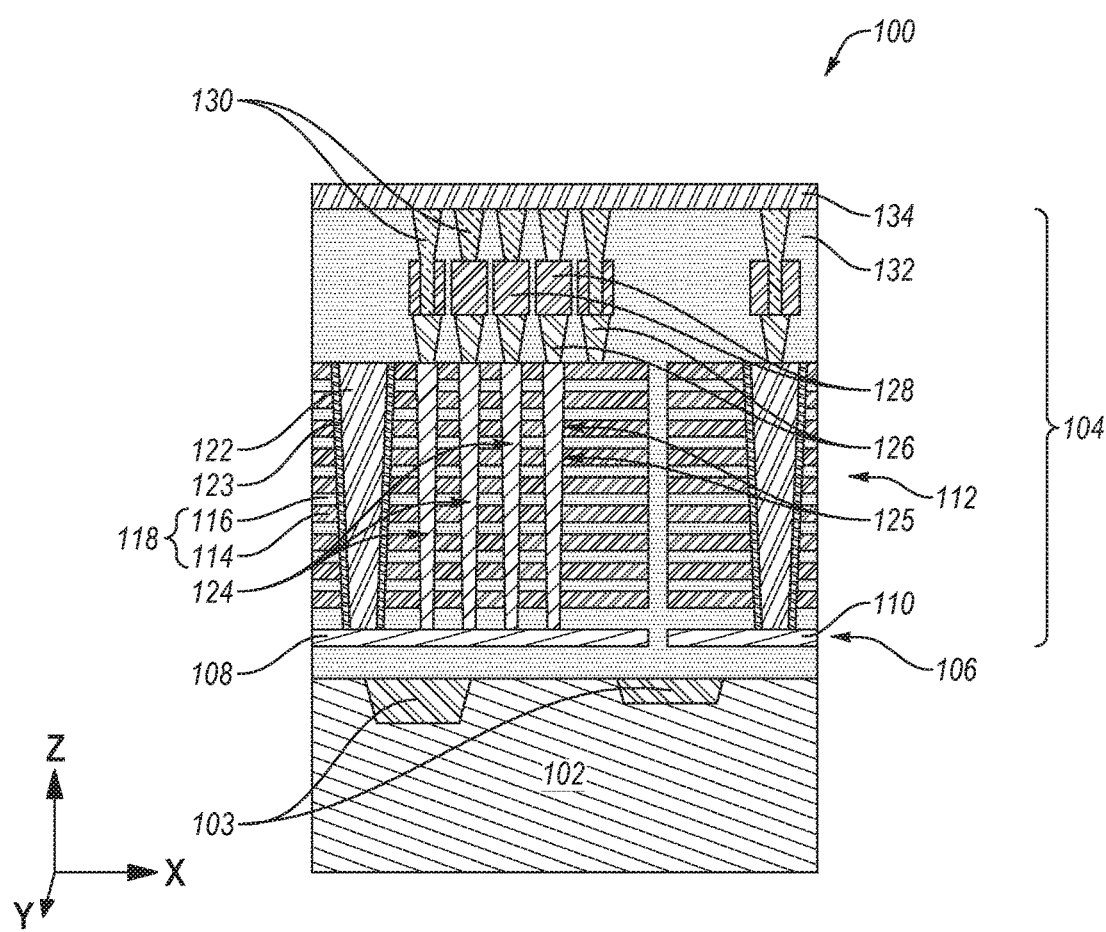
FIGS. 1A through 1D are simplified, partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization, or other known methods.

FIGS. 1A through 1D are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein may be used to form various devices and electronic systems.

Referring to FIG. 1A, a first microelectronic device structure 100 (e.g., a first die, a first chiplet) may be formed to include a semiconductive base structure 102, and a memory array region 104 over the semiconductive base structure 102. The memory array region 104 includes a stack structure 112, deep contact structures 122 and cell pillar structures 124 vertically extending through the stack structure 112, a source tier 106 under the stack structure 112, digit line structures 126 (e.g., bit line structures, data line structures) over the stack structure 112, insulative line structures 128 over the digit line structures 126, and digit line contact structures 130 vertically extending through the insulative line structures 128 to the digit line structures 126. The first microelectronic device structure 100 (including the semiconductive base structure 102 and the memory array region 104 thereof) also includes additional features (e.g., structures, materials, devices), as described in further detail below.

The semiconductive base structure 102 comprises a base material or construction upon which additional features (e.g., materials, structures, devices) of the first microelectronic device structure 100 are formed. The semiconductive base structure 102 may comprise a semiconductive structure (e.g., a semiconductive wafer), or a base semiconductive material on a supporting structure. For example, the semiconductive base structure 102 may comprise a conventional silicon substrate (e.g., a conventional silicon wafer), or another bulk substrate comprising a semiconductive material (e.g., one or more of monocrystalline silicon; polycrystalline silicon; silicon-germanium; germanium; gallium arsenide; a gallium nitride; gallium phosphide; indium phosphide; indium gallium nitride; and aluminum gallium nitride). In some embodiments, the semiconductive base structure 102 comprises a silicon wafer. The semiconductive base structure 102 may include one or more layers, structures, and/or regions formed therein and/or thereon.

As shown in FIG. 1A, one or more filled trenches 103 (e.g., filled openings, filled vias, filled apertures) may formed to vertically extend (e.g., in the Z-direction) partially (e.g., less than completely) through the semiconductive base structure 102. If formed, each of the filled trenches 103 may be formed to exhibit substantially the same dimensions and shape as each other of the filled trenches 103, or at least one of the filled trenches 103 may be formed to exhibit one or more of different dimensions and a different shape than at least one other of the filled trenches 103. As a non-limiting example, each of the filled trenches 103 may be formed to exhibit substantially the same vertical dimension(s) and substantially the same vertical cross-sectional shape(s) as each other of the filled trenches 103; or at least one of the filled trenches 103 may be formed to exhibit one or more of different vertical dimension(s) and different vertical cross-sectional shape(s) than at least one other of the filled trenches 103. As depicted in FIG. 1A, in some embodiments, at least one of the filled trenches 103 is formed to vertically extend to and terminate at a relatively deeper depth within the semiconductive base structure 102 than at least one other of the filled trenches 103. In additional embodiments, the filled trenches 103 are all formed to vertically extend to and terminate at substantially the same depth within the semiconductive base structure 102. As another non-limiting example, each of the filled trenches 103 may be formed to exhibit substantially the same horizontal dimension(s) and substantially the same horizontal cross-sectional shape(s) as each other of the filled trenches 103; or at least one of the filled trenches 103 may be formed to exhibit one or more of different horizontal dimension(s) (e.g., relatively larger horizontal dimension(s), relatively smaller horizontal dimension(s)) and different horizontal cross-sectional shape(s) than at least one other of the filled trenches 103.

If formed, the filled trenches 103 may be substantially filled with one or more materials, such as one or more of at least one insulative material, at least one conductive material, and at least one semiconductive material. In some embodiments, at least one (e.g., each) of the filled trenches 103 is filled with at least one insulative material. At least one (e.g., each) of the filled trenches 103 may, for example, be employed as a shallow trench isolation (STI) structure within the semiconductive base structure 102. In additional embodiments, at least one (e.g., each) of the filled trenches 103 is filled with at least one conductive material. At least one of the filled trenches 103 may, for example, be employed to facilitate electrical connection between one or more components of the first microelectronic device structure 100 at a first side (e.g., a front side, a top side) of the semiconductive base structure 102 and additional components (e.g., one or more structures and/or devices) to be provided at a second, opposing side (e.g., a back side, a bottom side) of the semiconductive base structure 102 following subsequent processing (e.g., thinning) of the semiconductive base structure 102, as described in further detail below. In additional embodiments, the filled trenches 103 are omitted (e.g., absent) from the semiconductive base structure 102.

With continued reference to FIG. 1A, the source tier 106 may be vertically interposed between the semiconductive base structure 102 and the stack structure 112 overlying the semiconductive base structure 102. The source tier 106 may include at least one source structure 108 (e.g., a source plate), and at least one contact pad 110. The source structure(s) 108 and the contact pad(s) 110 may horizontally neighbor one another (e.g., in the X-direction, in the Y-direction) within the source tier 106. The source structure(s) 108 may be electrically isolated from the contact pad(s) 110, and may be positioned at substantially the same vertical position (e.g., in the Z-direction) as the contact pad(s) 110. At least one insulative material may be interposed between the source structure(s) 108, the contact pad(s) 110, the semiconductive base structure 102, and the stack structure 112, as described in further detail below.

The source structure(s) 108 and the contact pad(s) 110 may each be formed of and include conductive material. A material composition of the source structure(s) 108 may be substantially the same as a material composition of the contact pad(s) 110. In some embodiments, the source structure(s) 108 and the contact pad(s) 110 are formed of and include one or more of a metal, an alloy, and a conductive metal-containing material (e.g., a conductive metal nitride, a conductive metal silicide, a conductive metal carbide, a conductive metal oxide). As a non-limiting example, the source structure(s) 108 and the contact pad(s) 110 may be formed of and include W. In addition embodiments, the source structure(s) 108 and the contact pad(s) 110 are formed of and include conductively doped semiconductive material, such as a conductively doped form of one or more of a silicon material, such as monocrystalline silicon or polycrystalline silicon; a silicon-germanium material; a germanium material; a gallium arsenide material; a gallium nitride material; and an indium phosphide material. As a non-limiting example, the source structure(s) 108 and the contact pad(s) 110 may be formed of and include silicon (e.g., polycrystalline silicon) doped with at least one dopant (e.g., one or more of at least one n-type dopant, at least one p-type dopant, and at least one other dopant).

The source structure(s) 108 of the source tier 106 may be coupled to the cell pillar structures 124. In some embodiments, the source structure(s) 108 directly physically contact the cell pillar structures 124. In additional embodiments, contact structures may vertically intervene between the source structure(s) 108 and the cell pillar structures 124. In addition, the source structure(s) 108 may also be coupled to and/or may subsequently be coupled to additional structures (e.g., contact structures, routing structures, pad structures) present within and/or to subsequently be present within (e.g., following subsequent processing acts) the first microelectronic device structure 100, as described in further detail below.

The contact pad(s) 110 of the source tier 106 may be coupled to additional conductive features (e.g., conductive contact structures, conductive pillars, conductively filled vias) within the stack structure 112. For example, as shown in FIG. 1A, the contact pad(s) 110 may be coupled to one or more of the deep contact structures 122 vertically extending through the stack structure 112. In some embodiments, the contact pad(s) 110 directly physically contact the deep contact structure(s) 122. In additional embodiments, additional contact structures may vertically intervene between the contact pad(s) 110 and the deep contact structure(s) 122, and may electrically couple the contact pad(s) 110 to the deep contact structure(s) 122. In addition, the contact pad(s) 110 may be coupled to additional structures (e.g., interconnect structures, routing structures, pad structures) may also be coupled to and/or may subsequently be coupled to additional structures (e.g., contact structures, routing structures, pad structures) present within and/or to subsequently be present within (e.g., following subsequent processing acts) the first microelectronic device structure 100, as described in further detail below.

Still referring to FIG. 1A, the stack structure 112 may be formed to vertically overlie the source tier 106, and may include a vertically alternating (e.g., in the Z-direction) sequence of conductive structures 114 and insulative structures 116 arranged in tiers 118. Each of the tiers 118 of the stack structure 112 may include at least one of the conductive structures 114 vertically neighboring at least one of the insulative structures 116. The stack structure 112 may be formed to include any desired number of the tiers 118, such as greater than or equal to sixteen (16) of the tiers 118, greater than or equal to thirty-two (32) of the tiers 118, greater than or equal to sixty-four (64) of the tiers 118, greater than or equal to one hundred and twenty-eight (128) of the tiers 118, or greater than or equal to two hundred and fifty-six (256) of the tiers 118.

The conductive structures 114 of the tiers 118 of the stack structure 112 may be formed of and include conductive material. By way of non-limiting example, the conductive structures 114 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 114 are formed of and include W. Each of the conductive structures 114 may individually be substantially homogeneous, or one or more of the conductive structures 114 may individually be substantially heterogeneous. As used herein, the term "homogeneous" means amounts of a material do not vary throughout different portions (e.g., different horizontal portions, different vertical portions) of a structure. Conversely, as used herein, the term "heterogeneous" means amounts of a material vary throughout different portions of a structure. In some embodiments, each of the conductive structures 114 is formed to be substantially homogeneous. In additional embodiments, each of the conductive structures 114 is formed to be heterogeneous. Each conductive structures 114 may, for example, be formed of and include a stack of at least two different conductive materials.

Optionally, one or more liner materials (e.g., insulative liner material(s), conductive liner material(s)) may be formed around the conductive structures 114. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 114. In some embodiments, the liner material(s) comprise titanium nitride. In further embodiments, the liner material(s) further include aluminum oxide. As a non-limiting example, aluminum oxide may be formed directly adjacent the insulative structures 116, titanium nitride may be formed directly adjacent the aluminum oxide, and tungsten may be formed directly adjacent the titanium nitride. For clarity and ease of understanding the description, the liner material(s) are not illustrated in FIG. 1A, but it will be understood that the liner material(s) may be disposed around the conductive structures 114.

The insulative structures 116 of the tiers 118 of the stack structure 112 may be formed of and include at least one insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 116 is formed of and includes a dielectric oxide material, such as $SiO_x$ (e.g., $SiO_2$). Each of the insulative structures 116 may individually be substantially homogeneous, may be or a substantially heterogeneous. In some embodiments, each of the insulative structures 116 is substantially homogeneous. In further embodiments, at least one of the insulative structures 116 is substantially heterogeneous. One or more of the insulative structures 116 may, for example, be formed of and include a stack (e.g., laminate) of at least two different insulative materials.

The cell pillar structures 124 may vertically extend through the tiers 118 of the stack structure 112. The cell pillar structures 124 may each individually be formed of and include a stack of materials. By way of non-limiting example, each of the cell pillar structures 124 may be formed to include a first dielectric oxide material (e.g., $SiO_x$, such as $SiO_2$; $AlO_x$, such as $Al_2O_3$), a dielectric nitride material (e.g., $SiN_y$, such as $Si_3N_4$), a second oxide dielectric material (e.g., $SiO_x$, such as $SiO_2$), a semiconductive material (e.g., Si, such as polycrystalline Si), and a dielectric fill material (e.g., a dielectric oxide, a dielectric nitride, air). The first dielectric oxide material may be formed on or over surfaces of the conductive structures 114 and the insulative structures 116 of the tiers 118 of stack structure 112 at least partially defining horizontal boundaries of the cell pillar structures 124; the dielectric nitride material may horizontally surrounded by the first dielectric oxide material; the second oxide dielectric material may horizontally surrounded by the dielectric nitride material; the semiconductive material may horizontally surrounded by the second oxide dielectric material; and the dielectric fill material may horizontally surrounded by the semiconductive material.

With continued reference to FIG. 1A, intersections of the cell pillar structures 124 and the conductive structures 114 of the tiers 118 of the stack structure 112 may define vertically extending strings of memory cells 125 coupled in series with one another within the stack structure 112. In some embodiments, the memory cells 125 formed at the intersections of the conductive structures 114 and the cell pillar structures 124 within different tiers 118 of the stack structure 112 comprise so-called "MONOS" (metal-oxide-nitride-oxide-semiconductor) memory cells. In additional embodiments, the memory cells 125 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 125 comprise so-called "floating gate" memory cells including floating gates (e.g., metallic floating gates) as charge storage structures. The floating gates may horizontally intervene between central structures of the cell pillar structures 124 and the conductive structures 114 of the different tiers 118 of the stack structure 112.

As shown in FIG. 1A, the deep contact structures 122 may also vertically extend through the tiers 118 of the stack structure 112. The deep contact structures 122 may be configured and positioned to electrically connect one or more features (e.g., structures, material, devices) of the first microelectronic device structure 100 vertically overlying the stack structure 112 with one or more additional features of the first microelectronic device structure 100 vertically underlying the stack structure 112. The deep contact structures 122 may be formed of and include conductive material. In some embodiments, the deep contact structures 122 are formed of and include W. In additional embodiments, the deep contact structures 122 are formed of and include conductively doped polycrystalline silicon.

Still referring to FIG. 1A, insulative liner structures 123 may be formed to substantially continuously extend over and substantially cover side surfaces of the deep contact structures 122. The insulative liner structures 123 may be horizontally interposed between the deep contact structures 122 and the conductive structures 114 (and the insulative structures 116) of the tiers 118 of the stack structure 112. The insulative liner structures 123 may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative liner structures 123 is formed of and includes at least one dielectric oxide material (e.g., $SiO_x$, such as $SiO_2$).

The digit line structures 126 may be formed vertically over and in electrical communication with the cell pillar structures 124 (and, hence, the vertically extending strings of memory cells 125) and the deep contact structures 122. The digit line structures 126 may exhibit horizontally elongate shapes extending in parallel in a first horizontal direction (e.g., the Y-direction). As used herein, the term "parallel" means substantially parallel. The digit line structures 126 may each exhibit substantially the same dimensions (e.g., width in the X-direction, length in a Y-direction, height in the Z-direction), shape, and spacing (e.g., in the X-direction). In additional embodiments, one or more of the digit line structures 126 may exhibit one or more of at least one different dimension (e.g., a different length, a different width, a different height) and a different shape than one or more other of the digit line structures 126, and/or the spacing (e.g., in the X-direction) between at least two horizontally neighboring digit line structures 126 may be different than the spacing between at least two other horizontally neighboring digit line structures 126.

The digit line structures 126 may be formed of and include conductive material. By way of non-limiting example, the digit line structures 126 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the digit line structures 126 are each individually formed of and include W. Each of the digit line structures 126 may individually be substantially homogeneous, or one or more of the digit line structures 126 may individually be substantially heterogeneous. If a digit line structure 126 is heterogeneous, amounts of one or more elements included in the digit line structure 126 may vary stepwise (e.g., change abruptly), or may vary continuously (e.g., change progressively, such as linearly, parabolically) throughout different portions of the digit line structure 126. In some embodiments, each of the digit line structures 126 is substantially homogeneous. In additional embodiments, each of the digit line structures 126 is heterogeneous. Each digit line structures 126 may, for example, be formed of and include a stack of at least two different conductive materials.

The insulative line structures 128 may be formed on or over the digit line structures 126. The insulative line structures 128 may serve as insulative cap structures (e.g., dielectric cap structures) for the digit line structures 126. The insulative line structures 128 may have horizontally elongate shapes extending in parallel in the first horizontal direction (e.g., the Y-direction). Horizontal dimensions, horizontal pathing, and horizontal spacing of the insulative line structures 128 may be substantially the same as the horizontal dimensions, horizontal pathing, and horizontal spacing of the digit line structures 126.

The insulative line structures 128 may be formed of and include insulative material. By way of non-limiting example, the insulative line structures 128 may each individually be formed of and include a dielectric nitride material, such as $SiN_y$ (e.g., $Si_3N_4$). The insulative line structures 128 may each be substantially homogeneous, or one or more of the insulative line structures 128 may be heterogeneous. If an insulative line structure 128 is heterogeneous, amounts of one or more elements included in the insulative line structure 128 may vary stepwise (e.g., change abruptly), or may vary continuously (e.g., change progressively, such as linearly, parabolically) throughout different portions of the insulative line structure 128. In some embodiments, each of the insulative line structures 128 is substantially homogeneous. In additional embodiments, each of the insulative line structures 128 is heterogeneous. Each insulative line structures 128 may, for example, be formed of and include a stack of at least two different dielectric materials.

The digit line contact structures 130 may be formed to vertically extend through the insulative line structures 128, and may contact the digit line structures 126. For each digit line contact structure 130, a first portion thereof may vertically overlie one of the insulative line structures 128, and a second portion thereof may vertically extend through the insulative line structure 128 and contact (e.g., physically contact, electrically contact) one of the digit line structures 126. The individual digit line contact structures 130 may be at least partially (e.g., substantially) horizontally aligned in the X-direction with individual insulative line structures 128 (and, hence, individual digit line structures 126). For example, horizontal centerlines of the digit line contact structures 130 in the X-direction may be substantially aligned with horizontal centerlines of the insulative line structures 128 in the X-direction. In addition, the digit line contact structures 130 may be formed at desired locations in the Y-direction along the insulative line structures 128 (and, hence, the digit line structures 126). In some embodiments, at least some of the digit line contact structures 130 are provided at different positions in the Y-direction than one another. For example, a first of the digit line contact structures 130 may be provided at different position along a length in the Y-direction of a first of the insulative line structures 128 as compared to a position of a second of the digit line contact structures 130 along a length in the Y-direction of a second of the insulative line structures 128. Put another way, at least some (e.g., all) of the digit line contact structures 130 may be horizontally offset from one another in the Y-direction. In additional embodiments, two or more of the digit line contact structures 130 are horizontally aligned with one another in the Y-direction. In some embodiments, the digit line contact structures 130 are employed as digit line contact structures (e.g., data line contact structures, bit line contact structures) for a microelectronic device (e.g., a memory device) to be formed using the first microelectronic device structure 100.

The digit line contact structures 130 may each individually be formed of and include conductive material. By way of non-limiting example, the digit line contact structures 130 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit line contact structures 130 are formed of and include Cu. In additional embodiments, the digit line contact structures 130 are formed of and include W.

Still referring to FIG. 1A, at least one isolation material 132 may be formed to cover and surround of portions of the semiconductive base structure 102, the source structure(s) 108, the contact pad(s) 110, stack structure 112 (including the conductive structures 114 and the insulative structures 116 thereof), the digit line structures 126, the insulative line structures 128, and the digit line contact structures 130. The isolation material 132 may be formed of and include at least one insulative material. By way of non-limiting example, the isolation material 132 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 132 is formed of and includes $SiO_x$ (e.g., $SiO_2$). The isolation material 132 may be substantially homogeneous, or the isolation material 132 may be heterogeneous. If the isolation material 132 is heterogeneous, amounts of one or more elements included in the isolation material 132 may vary stepwise (e.g., change abruptly), or may vary continuously (e.g., change progressively, such as linearly, parabolically) throughout different portions of the isolation material 132. In some embodiments, the isolation material 132 is substantially homogeneous. In additional embodiments, the isolation material 132 is heterogeneous. The isolation material 132 may, for example, be formed of and include a stack of at least two different dielectric materials.

With continued reference to FIG. 1A, at least one dielectric structure 134 may be formed on or over upper surfaces of the digit line contact structures 130. The dielectric structure 134 may exhibit a substantially planar upper surface, and may be employed for a subsequent bonding process, as described in further detail below. The dielectric structure 134 may be formed of and include at least one insulative material. A material composition of the dielectric structure 134 may be substantially the same as a material composition of the isolation material 132, or may be different than the material composition of the isolation material 132. The dielectric structure 134 may comprise a portion of the isolation material 132 vertically overlying upper surfaces of the digit line contact structures 130, or may comprise an additional structure formed on or over upper surfaces of the digit line contact structures 130 and the isolation material 132. In some embodiments, the dielectric structure 134 is formed of and includes a dielectric oxide material, such as $SiO_x$ (e.g., $SiO_2$). The dielectric structure 134 may be substantially homogeneous, or the dielectric structure 134 may be heterogeneous. If the dielectric structure 134 is heterogeneous, amounts of one or more elements included in the dielectric structure 134 may vary stepwise (e.g., change abruptly), or may vary continuously (e.g., change progressively, such as linearly, parabolically) throughout different portions of the dielectric structure 134. In some embodiments, the dielectric structure 134 is substantially homogeneous. In additional embodiments, the dielectric structure 134 is heterogeneous. The dielectric structure 134 may, for example, be formed of and include a stack of at least two different dielectric materials.

Figure 1B:
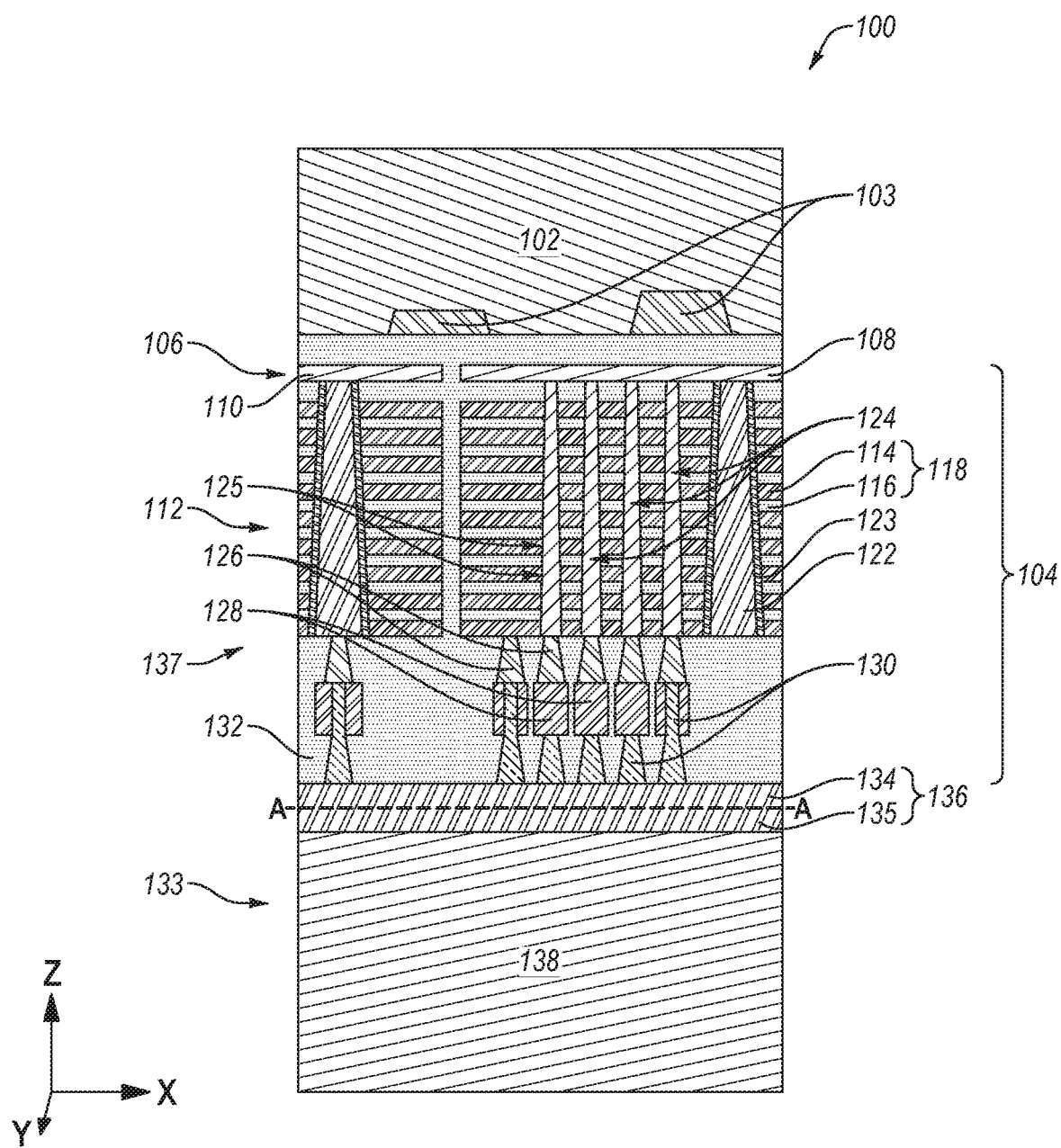

Referring to next to FIG. 1B, the first microelectronic device structure 100 may be attached (e.g., bonded) to a second microelectronic device structure 133 (e.g., a second die, a second chiplet) to form a microelectronic device structure assembly 137. The second microelectronic device structure 133 may include a base structure 138 and an additional dielectric structure 135 formed on, over, or within the base structure 138. As shown in FIG. 1B, the first microelectronic device structure 100 may be vertically inverted (e.g., flipped upside down in the Z-direction) and the dielectric structure 134 thereof may be attached (e.g., bonded, such as through oxide-oxide bonding) to the additional dielectric structure 135 of the second microelectronic device structure 133 to form the microelectronic device structure assembly 137. Attaching (e.g., bonding) the dielectric structure 134 of the first microelectronic device structure 100 to the additional dielectric structure 135 of the second microelectronic device structure 133 may form a connected dielectric structure 136 of the microelectronic device structure assembly 137. Alternatively, the second microelectronic device structure 133 may be vertically inverted (e.g., flipped upside down in the Z-direction) and attached to the first microelectronic device structure 100 to form the microelectronic device structure assembly 137.

The base structure 138 of the second microelectronic device structure 133 comprises a base material or construction upon which additional features (e.g., materials, structures, devices) may be formed. In some embodiments, the base structure 138 comprises a wafer (e.g., a base wafer, a support wafer). The base structure 138 may be formed of and include one or more of semiconductive material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductive material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha$-$Al_2O_3$), and silicon carbide). By way of non-limiting example, the base structure 138 may comprise a semiconductive wafer (e.g., a silicon wafer), a glass wafer, or a ceramic wafer. The base structure 138 may include one or more layers, structures, and/or regions formed therein and/or thereon.

The additional dielectric structure 135 of the second microelectronic device structure 133 may be formed of and include at least one insulative material. A material composition of the additional dielectric structure 135 of the second microelectronic device structure 133 may be substantially the same as a material composition of the dielectric structure 134 of the first microelectronic device structure 100, or may be different than the material composition of the dielectric structure 134 of the first microelectronic device structure 100. In some embodiments, the additional dielectric structure 135 is formed of and includes a dielectric oxide material, such as $SiO_x$ (e.g., $SiO_2$). The additional dielectric structure 135 may be substantially homogeneous, or the additional dielectric structure 135 may be heterogeneous. If the additional dielectric structure 135 is heterogeneous, amounts of one or more elements included in the additional dielectric structure 135 may vary stepwise (e.g., change abruptly), or may vary continuously (e.g., change progressively, such as linearly, parabolically) throughout different portions of the additional dielectric structure 135. In some embodiments, the additional dielectric structure 135 is substantially homogeneous. In additional embodiments, the additional dielectric structure 135 is heterogeneous. The additional dielectric structure 135 may, for example, be formed of and include a stack of at least two different dielectric materials.

While in FIG. 1B, the dielectric structure 134 and the additional dielectric structure 135 of the connected dielectric structure 136 of the microelectronic device structure assembly 137 are distinguished from one another by way of a dashed line, the dielectric structure 134 and the additional dielectric structure 135 may be integral and continuous with one another. Put another way, the connected dielectric structure 136 may be a substantially monolithic structure including the dielectric structure 134 as a first region (e.g., a vertically upper region) thereof, and the additional dielectric structure 135 as a second region (e.g., a vertically lower region) thereof. For the connected dielectric structure 136, the dielectric structure 134 thereof may be attached to the additional dielectric structure 135 thereof without a bond line.

Figure 1C:
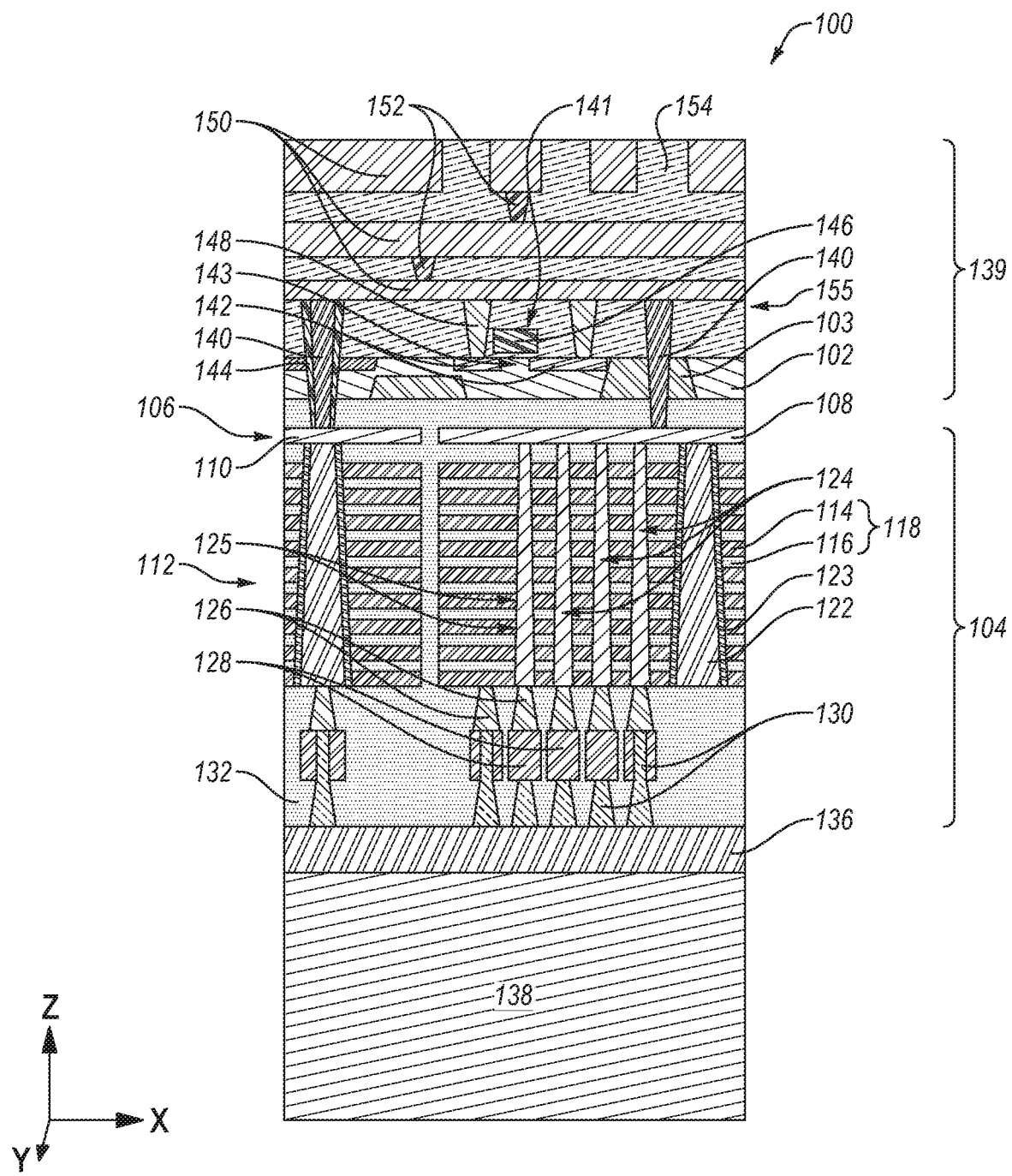

Referring next to FIG. 1C, a portion of the semiconductive base structure 102 may be removed (e.g., through conventional etching process and/or a conventional grinding process), and then a control logic region 139 may be formed over the memory array region 104. As shown in FIG. 1C, the control logic region 139 may include a remaining (e.g., unremoved) portion of the semiconductive base structure 102 (including remaining portions of the filled trenches 103 formed therein, if any), transistors 141, first contact structures 148, first routing structures 150, and second contact structures 152. The transistors 141, the first contact structures 148, the first routing structures 150, and the second contact structures 152 may form control logic circuitry of various control logic devices 155 of the control logic region 139, as described in further detail below. The control logic region 139 may also include third contact structures 140 formed to couple one or more of the features (e.g., structures, materials, devices) of the control logic region 139 to more of more of the features of the memory array region 104 thereunder. The third contact structures 140 may, for example, be formed to couple one or more of the first routing structures 150 of the control logic region 139 to the source structure(s) 108 and the contact pad(s) 110 of the source tier 106 of the memory array region 104. The control logic region 139 further includes additional features (e.g., structures, materials, devices), as also described in further detail below.

If present, one or more of the filled trenches 103 within the semiconductive base structure 102 may be utilized as so-called "stop" structure(s) (e.g., etch stop structure(s)) for the controlled removal of the portion of the semiconductive base structure 102. The removal of the semiconductive base structure 102 may, for example, terminate (e.g., stop) upon reaching an upper vertical boundary of the filled trench(es)

103. As shown in FIG. 1C, in some embodiments wherein one or more of the filled trenches 103 are formed (e.g., at the processing stage previously described with reference to FIG. 1A) to vertically extend to different depths within the semiconductive base structure 102 than one or more other of the filled trenches 103, the remaining portion of the semiconductive base structure 102 may cover upper surfaces of some of the filled trenches 103 (e.g., at least some of the filled trenches 103 previously formed to vertically extend to relatively shallower depths within the semiconductive base structure 102 than at least some other of the filled trenches). Put another way, upper vertical boundaries of at least some (e.g., less than all, all) of the filled trenches 103 may be vertically offset (e.g., vertically underlie) from an upper vertical boundary of the remaining portion of the semiconductive base structure 102. In additional embodiments, the upper vertical boundary of the remaining portion of the semiconductive base structure 102 may be formed to be substantially coplanar with the upper vertical boundaries of all of the filled trenches 103.

As shown in FIG. 1C, the transistors 141 of the control logic region 139 may be formed to vertically intervene between the source tier 106 of the memory array region 104 and the first routing structures 150 of the control logic region 139. The transistors 141 may be formed to include conductively doped regions 142 (e.g., serving as source regions and drain regions of the transistors 141) within the semiconductive base structure 102, channel regions 143 within the semiconductive base structure 102 and horizontally interposed between the conductively doped regions 142, and gate structures 146 vertically overlying the channel regions 143. The transistors 141 may also include gate dielectric material (e.g., a dielectric oxide) formed to vertically intervene (e.g., in the Z-direction) between the gate structures 146 and the channel regions 143.

For the transistors 141 of the control logic region 139, the conductively doped regions 142 within the semiconductive base structure 102 may be doped with one or more desirable dopants. In some embodiments, the conductively doped regions 142 are doped with at least one N-type dopant (e.g., one or more of phosphorus, arsenic, antimony, and bismuth). In some of such embodiments, the channel regions 143 within the semiconductive base structure 102 are doped with at least one P-type dopant (e.g., one or more of boron, aluminum, and gallium). In some other of such embodiments, the channel regions 143 within the semiconductive base structure 102 are substantially undoped. In additional embodiments, the conductively doped regions 142 are doped with at least one P-type dopant (e.g., one or more of boron, aluminum, and gallium). In some of such additional embodiments, the channel regions 143 within the semiconductive base structure 102 are doped with at least one N-type dopant (e.g., one or more of phosphorus, arsenic, antimony, and bismuth). In some other of such additional embodiments, the channel regions 143 within the semiconductive base structure 102 are substantially undoped.

The gate structures 146 may individually horizontally extend (e.g., in the Y-direction) between and be employed by multiple transistors 141 of the control logic region 139. The gate structures 146 may be formed of and include conductive material. The gate structures 146 may individually be substantially homogeneous, or the gate structures 146 may individually be heterogeneous. If an individual gate structure 146 is heterogeneous, amounts of one or more elements included in the gate structure 146 may vary stepwise (e.g., change abruptly), or may vary continuously (e.g., change progressively, such as linearly, parabolically) throughout different portions of the gate structure 146. In some embodiments, the gate structures 146 are each substantially homogeneous. In additional embodiments, the gate structures 146 are each heterogeneous. Individual gate structures 146 may, for example, be formed of and include a stack of at least two different dielectric materials.

Still referring to FIG. 1C, the first contact structures 148 may be formed to vertically extend between and couple the conductively doped regions 142 within the semiconductive base structure 102 (and, hence, the transistors 141) to one or more of the first routing structures 150. The first contact structures 148 may each individually be formed of and include conductive material. By way of non-limiting example, the first contact structures 148 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 148 are formed of and include W. In additional embodiments, the first contact structures 148 are formed of and include Cu.

The first routing structures 150 may vertically overlie (e.g., in the Z-direction) the first contact structures 148 and the transistors 141 of the control logic region 139. At least some of the first routing structures 150 may be employed as local routing structures of a microelectronic device (e.g., a memory device, such as a 3D NAND Flash memory device). The first routing structures 150 may each individually be formed of and include conductive material. By way of non-limiting example, the first routing structures 150 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 150 are formed of and include Cu. In additional embodiments, the first routing structures 150 are formed of and include W.

The second contact structures 152 may vertically extend between and couple some of the first routing structures 150 to one another. The second contact structures 152 may each individually be formed of and include conductive material. By way of non-limiting example, second contact structures 152 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second contact structures 152 are formed of and include Cu. In additional embodiments, the second contact structures 152 are formed of and include W.

As previously mentioned, transistors 141, the first contact structures 148, the first routing structures 150, and the second contact structures 152 form control logic circuitry of various control logic devices 155 of the control logic region 139. In some embodiments, the control logic devices 155 comprise complementary metal-oxide-semiconductor (CMOS) circuitry. The control logic devices 155 may be configured to control various operations of other components (e.g., memory cells) of a microelectronic device (e.g., a memory device) to subsequently be formed using microelectronic device structure assembly 137. As a non-limiting example, the control logic devices 155 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry.

With continued reference to FIG. 1C, the third contact structures 140 may be formed to vertically extend from one or more of the first routing structures 150, through the remaining portion of the semiconductive base structure 102, and to the source tier 106 of the memory array region 104. The third contact structures 140 may at least partially fill vias (e.g., through silicon vias (TSVs), through STI vias) formed to vertically extend from the first routing structure(s) 150, through the remaining portion of the semiconductive base structure 102, and to the source tier 106 of the memory array region 104. As shown in FIG. 1C, one or more of the third contact structures 140 vertically extend to the source structure(s) 108 of the source tier 106, and one or more other the third contact structures 140 vertically extend to the contact pad(s) 110 of the source tier 106. One or more of the third contact structures 140 may be formed to vertically extend through one or more of the filled trenches 103 (e.g., STI structures) within the remaining portion of the semiconductive base structure 102. In addition, one or more other of the third contact structures 140 may be formed to vertically extend through one or more other regions of the remaining portion of the semiconductive base structure 102 outside of horizontal boundaries of the filled trenches 103.

The third contact structures 140 may be formed of and include conductive material. The third contact structures 140 may facilitate electrical connections between the control logic devices 155 of the control logic region 139 and the source structure(s) 108 and the contact pad(s) 110 of the source tier 106 of the memory array region 104. In some embodiments, the third contact structures 140 may each individually comprise metallic material, such as one or more of at least one metal, at least one alloy, and at least one conductive metal-containing material (e.g., a conductive metal nitride, a conductive metal silicide, a conductive metal carbide, a conductive metal oxide). In some embodiments, the third contact structures 140 are formed of and include W.

With continued reference to FIG. 1C, at least one insulative liner material 144 may be formed to substantially continuously extend over and substantially cover side surfaces of one or more of the third contact structures 140. The insulative liner material 144 may partially fill one or more vias (e.g., one or more TSVs) containing the one or more of the third contact structures 140. The insulative liner material 144 may be horizontally interposed between the third contact structure(s) 140 the remaining portion of the semiconductive base structure 102. The insulative liner material 144 may also be horizontally interposed between the third contact structure(s) 140 and one or more conductive structures formed in, on, or over the semiconductive base structure 102. The insulative liner material 144 may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric oxynitride material (e.g., $SiO_xN_y$), at least one dielectric carboxynitride material (e.g., $SiO_xC_zN_y$). In some embodiments, the insulative liner material 144 is formed of and includes at least one dielectric oxide material (e.g., $SiO_x$, such as $SiO_2$).

Still referring to FIG. 1C, at least one additional isolation material 154 may be formed to cover and surround of the remaining portion of the semiconductive base structure 102, as well as portions of the transistors 141, the first routing structures 150, the first contact structures 148, the second contact structures 152, the third contact structures 140, and the insulative liner material 144. The additional isolation material 154 may be formed of and include at least one insulative material. By way of non-limiting example, the additional isolation material 154 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the additional isolation material 154 is formed of and includes $SiO_x$ (e.g., $SiO_2$). The additional isolation material 154 may be substantially homogeneous, or the isolation material 132 may be heterogeneous. If the additional isolation material 154 is heterogeneous, amounts of one or more elements included in the additional isolation material 154 may vary stepwise (e.g., change abruptly), or may vary continuously (e.g., change progressively, such as linearly, parabolically) throughout different portions of the additional isolation material 154. In some embodiments, the additional isolation material 154 is substantially homogeneous. In additional embodiments, the additional isolation material 154 is heterogeneous. The additional isolation material 154 may, for example, be formed of and include a stack of at least two different dielectric materials.

The processing acts described above with reference to FIGS. 1A through 1C resolve limitations on conventional control logic device configurations and associated conventional microelectronic device performance (e.g., speed, data transfer rates, power consumption) that may otherwise result from thermal budget constraints imposed by conventional formation and/or conventional processing of arrays (e.g., memory cell arrays, memory element arrays, access device arrays) for a conventional microelectronic device. For example, by forming the control logic region 139 (FIG. 1D) after the formation of the memory array region 104, configurations of the control logic devices 155 within the control logic region 139 are not limited by the processing conditions (e.g., temperatures, pressures, materials) required to form components (e.g., memory cells, memory elements, access devices) of the memory array region 104.

Figure 1D:
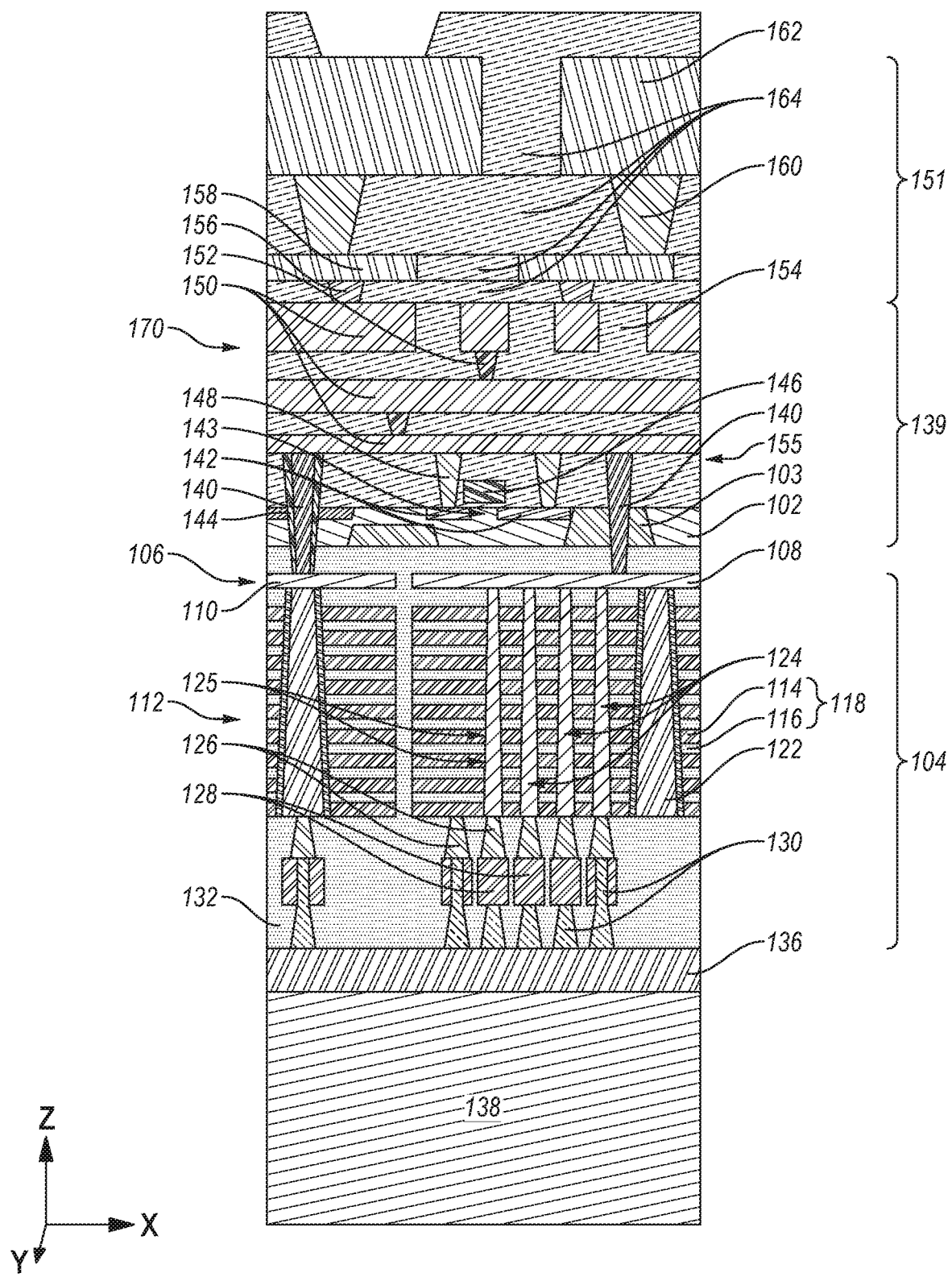

Referring next to FIG. 1D, an interconnect region 151 may be formed over the control logic region 139. The interconnect region 151 may be formed to include second routing structures 158 and conductive pads 162. The second routing structures 158 may vertically overlie the control logic region 139, and may be coupled to one or more of the first routing structures 150 by way of fourth contact structures 156. The fourth contact structures 156 may extend between the second routing structures 158 and the first routing structures 150 of the control logic region 139. The conductive pads 162 may vertically overlie the second routing structures 158, and may be coupled to the second routing structures 158 by way of fifth contact structures 160. The fifth contact structures 160 may extend from and between the second routing structures 158 and the conductive pads 162.

The second routing structures 158, the fourth contact structures 156, the conductive pads 162, and the fifth contact structures 160 may each be formed of and include conductive material. By way of non-limiting example, the second routing structures 158, the fourth contact structures 156, the conductive pads 162, and the fifth contact structures 160 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second routing structures 158 and the fourth contact structures 156 are each formed of and include Cu, the conductive pads 162 are formed of and include Al, and the fifth contact structures 160 are formed of and include W. In additional embodiments, the second routing structures 158 are formed of and include Cu, the conductive pads 162 are formed of and include Al, and the fourth contact structures 156 and the fifth contact structures 160 are each formed of and include W.

Still referring to FIG. 1D, at least one further isolation material 164 may be formed cover and surround the second routing structures 158, the fourth contact structures 156, the conductive pads 162, and the fifth contact structures 160. A material composition of the further isolation material 164 may be substantially the same as or may be different than a material composition of one or more of the isolation material 132 and the additional isolation material 154. In some embodiments, the further isolation material 164 is formed of and includes at least one dielectric oxide material, such as $SiO_x$ (e.g., $SiO_2$). In additional embodiments, the further isolation material 164 is formed of and includes at least one low-k dielectric material, such as one or more of $SiO_xC_y$, $SiO_xN_y$, $SiC_xO_yH_z$, and $SiO_xC_zN_y$. The further isolation material 164 may be substantially homogeneous, or the further isolation material 164 may be heterogeneous. If the further isolation material 164 is heterogeneous, amounts of one or more elements included in the further isolation material 164 may vary stepwise (e.g., change abruptly), or may vary continuously (e.g., change progressively, such as linearly, parabolically) throughout different portions of the further isolation material 164. In some embodiments, the further isolation material 164 is substantially homogeneous. In additional embodiments, the further isolation material 164 is heterogeneous. The further isolation material 164, for example, be formed of and include a stack of at least two different dielectric materials.

As shown in FIG. 1D, the formation of the interconnect region 151 may effectuate the formation of a microelectronic device 170 (e.g., a memory device, such as a 3D NAND Flash memory device). The microelectronic device 170 may include the memory array region 104, the control logic region 139 vertically overlying the memory array region 104, and the interconnect region 151 vertically overlying the control logic region 139. In some embodiments, the second routing structures 158 and the conductive pads 252 of the conductive pads 162 serve as global routing structures for the microelectronic device 170. The second routing structures 158 and the conductive pads 162 may, for example, be configured to receive global signals from an external bus, and to relay the global signals to other components (e.g., structures, devices) of the microelectronic device 170.

Thus, in accordance with embodiments of the disclosure, a method of forming a microelectronic device comprises forming a microelectronic device structure. The microelectronic device structure comprises a semiconductive base structure, and a memory array region vertically overlying the semiconductive base structure and comprising memory cells. The microelectronic device structure is attached to a base structure. A portion of the semiconductive base structure is removed after attaching the microelectronic device structure to a base structure. A control logic region is formed vertically over a remaining portion of the semiconductive base structure. The control logic region comprises control logic devices in electrical communication with the memory cells of the memory array region.

Furthermore, a microelectronic device according to embodiments of the disclosure comprises a memory array region, a control logic region vertically overlying the memory array region, and an interconnect region vertically overlying the control logic region. The memory array region comprises memory cells. The control logic region comprises a semiconductive structure vertically overlying the memory array region, transistors partially vertically overlying the semiconductive structure, first conductive routing structures vertically overlying and in electrical communication with the transistors, and first conductive contact structures vertically extending through the semiconductive structure and in electrical communication with the first conductive routing structures and the memory cells of the memory array region. The interconnect region comprises second conductive routing structures vertically overlying and in electrical communication with the first conductive routing structures, and conductive pad structures vertically overlying and in electrical communication with the second conductive routing structures.

In addition, in accordance with embodiments of the disclosure, a method of forming a memory device comprises forming a first memory device structure. The first memory device structure comprises a semiconductive base structure, a stack structure over the source structure, the stack structure comprising tiers each comprising a conductive structure and an insulative structure vertically neighboring the conductive structure, digit line structures over the stack structure, strings of memory cells vertically extending through stack structure and in electrical communication with the source structure and the digit line structures, and a first dielectric structure over the digit line structures. A second memory device structure is formed. The second memory device structure comprises a base structure and a second dielectric structure over the base structure. The first dielectric structure of the first memory device structure is bonded to the second dielectric structure of the second memory device structure. Control logic circuitry is formed over and in electrical communication with the source structure after bonding the first dielectric structure of the first memory device structure to the second dielectric structure of the second memory device structure.

Moreover, a memory device according to embodiments of the disclosure comprises a base structure; a dielectric structure overlying the base structure; digit line structures overlying the dielectric structure; a stack structure overlying the digit line structures and comprising vertically neighboring tiers, each of the vertically neighboring tiers individually comprising a conductive structure and an insulative structure vertically neighboring the conductive structure; at least one source structure overlying the stack structure; strings of memory cells vertically extending through the stack structure and coupled to the digit line structures and the at least one source structure; a semiconductive structure overlying the at least one source structure; control logic circuitry overlying the semiconductive structure; and conductive contact structures extending from the control logic circuitry, through the semiconductive structure, and to the at least one source structure.

Figure 2:
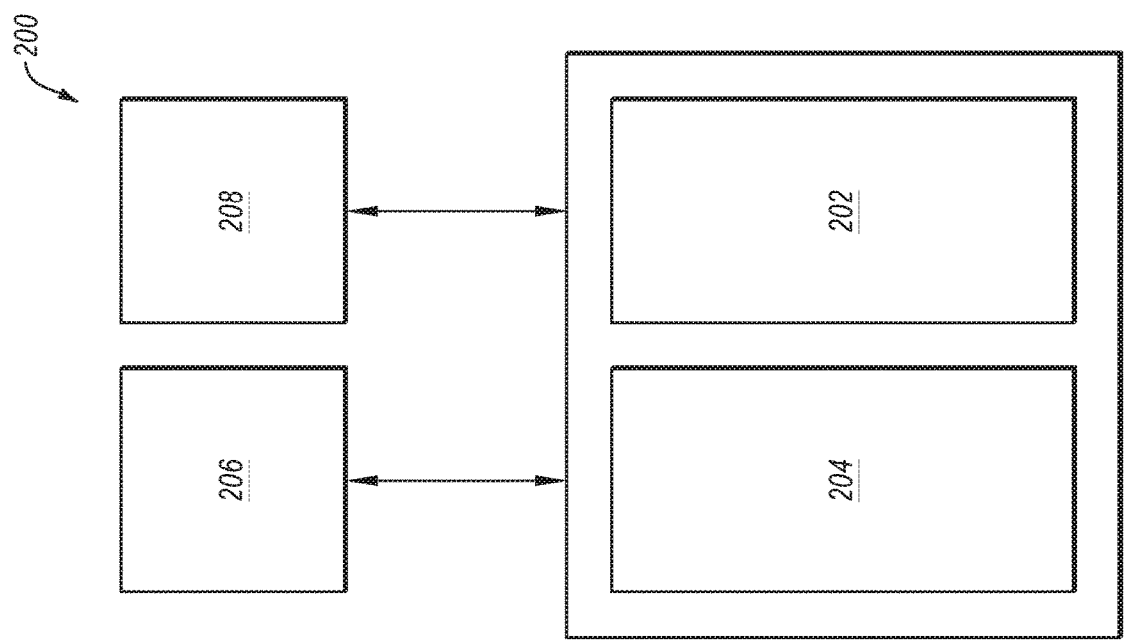
FIG. 2 is a schematic block diagram of an electronic system, in accordance with an embodiment of the disclosure.

Microelectronic devices (e.g., the microelectronic device 170 (FIG. 1D)) in accordance with embodiments of the disclosure may be used in embodiments of electronic systems of the disclosure. For example, FIG. 2 is a block diagram of an illustrative electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 200 includes at least one memory device 202. The memory device 202 may comprise, for example, a microelectronic device (e.g., the microelectronic device 170 (FIG. 1D)) previously described herein. The electronic system 200 may further include at least one electronic signal processor device 204 (often referred to as a "microprocessor"). The electronic signal processor device 204 may, optionally, include a microelectronic device (e.g., the microelectronic device 170 (FIG. 1D)) previously described herein. While the memory device 202 and the electronic signal processor device 204 are depicted as two (2) separate devices in FIG. 2, in additional embodiments, a single (e.g., only one) memory/processor device having the functionalities of the memory device 202 and the electronic signal processor device 204 is included in the electronic system 200. In such embodiments, the memory/processor device may include a microelectronic device (e.g., the microelectronic device 170 (FIG. 1D)) previously described herein. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touchscreen device that can be used both to input information to the electronic system 200 and to output visual information to a user. The input device 206 and the output device 208 may communicate electrically with one or more of the memory device 202 and the electronic signal processor device 204.

Thus, in accordance with embodiments of the disclosure, an electronic system comprises an input device, an output device, a processor device operably connected to the input device and the output device, and a memory device operably connected to the processor device. The memory device comprises a memory array region, a control logic region overlying the memory array region, and an interconnect region overlying the control logic region. The memory array region comprises an array of memory cells. The control logic region comprises CMOS circuitry in electrical communication with the array of memory cells. The CMOS circuitry comprises transistors overlying the array of memory cells, and copper routing structures overlying and in electrical communication with the transistors. The interconnect region comprises additional copper conductive routing structures overlying and in electrical communication with the CMOS circuitry, and aluminum pad structures overlying and in electrical communication with the additional copper conductive routing structures.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
   forming a microelectronic device structure, the microelectronic device structure comprising:
      a semiconductive base structure;
      one or more isolation structures partially vertically extending through the semiconductive base structure;
      a memory array region vertically overlying the semiconductive base structure and comprising memory cells; and
      a first dielectric material vertically overlying the memory cells;
   forming an additional microelectronic device structure separate from the microelectronic device structure, the additional microelectronic device structure comprising a base structure and a second dielectric material vertically overlying the base structure;
   bonding the second dielectric material of the additional microelectronic device structure to the first dielectric material of the microelectronic device structure to attach the additional microelectronic device structure to the microelectronic device structure;
   removing a portion of the semiconductive base structure down to a surface of at least one of the one or more isolation structures after attaching the additional microelectronic device structure to the microelectronic device structure; and
   forming a control logic region vertically over a remaining portion of the semiconductive base structure, the control logic region comprising control logic devices in electrical communication with the memory cells of the memory array region.

2. The method of claim 1, wherein forming a microelectronic device structure comprises forming the memory array region of the microelectronic device structure to further comprise:
   a source tier vertically overlying the semiconductive base structure and comprising at least one source structure;
   a stack structure vertically overlying the source tier and comprising a vertically alternating sequence of conductive structures and insulative structures;

cell pillar structures vertically extending through stack structure and in electrical communication with the at least one source structure of the source tier, portions of the cell pillar structures and the conductive structures of the stack structure forming vertically extending strings of the memory cells; and digit line structures overlying the stack structure and in electrical communication with the vertically extending strings of the memory cells, the first dielectric material vertically overlying the digit line structures.

3. The method of claim 2, further comprising forming the memory array region of the microelectronic device structure to further comprise conductive contact structures vertically extending through the stack structure.

4. The method of claim 1, wherein forming a control logic region vertically over a remaining portion of the semiconductive base structure comprises:

forming transistors at least partially vertically overlying the remaining portion of the semiconductive base structure; and forming conductive routing structures in electrical communication with the transistors, the transistors and the conductive routing structures forming control logic circuitry of the control logic devices of the control logic region.

5. The method of claim 4, wherein forming conductive routing structures in electrical communication with the transistors comprises forming copper routing structures in electrical communication with the transistors.

6. The method of claim 4, wherein forming transistors comprises forming each of the transistors to individually comprise:

a source region within the remaining portion of the semiconductive base structure;

a drain region within the remaining portion of the semiconductive base structure;

a channel region within the remaining portion of the semiconductive base structure and horizontally interposed between the source region and the drain region; and a gate structure vertically overlying and at least partially horizontally overlapping the channel region.

7. The method of claim 6, further comprising:

forming first conductive contact structures vertically extending between and coupling at least some of the conductive routing structures and at least some of the transistors;

forming second conductive contact structures vertically extending between and coupling pairs of the conductive routing structures; and forming third conductive contact structures vertically extending from one or more of conductive routing structures, through the remaining portion of the semiconductive base structure, and to at least one conductive structure vertically overlying and in electrical communication with the memory cells of the memory array region.

8. The method of claim 1, further comprising:

forming conductive routing structures over and in electrical communication with the control logic devices of the control logic region; and forming conductive pad structures over and in electrical communication with the conductive routing structures.

9. The method of claim 8, wherein:

forming conductive routing structures comprises forming the conductive routing structures to comprise copper; and forming conductive pad structures comprises forming the conductive pad structures to comprise aluminum.

10. A method of forming a memory device, comprising:

forming a first memory device structure, the first memory device structure comprising:

a semiconductive base structure;

one or more isolation structures partially vertically extending through the semiconductive base structure; and a source structure over the semiconductive base structure;

a stack structure over the source structure, the stack structure comprising tiers each comprising a conductive structure and an insulative structure vertically neighboring the conductive structure;

digit line structures over the stack structure;

strings of memory cells vertically extending through stack structure and in electrical communication with the source structure and the digit line structures; and a first dielectric structure over the digit line structures;

forming a second memory device structure, the second memory device structure comprising a base structure and a second dielectric structure over the base structure;

bonding the first dielectric structure of the first memory device structure to the second dielectric structure of the second memory device structure;

removing a portion of the semiconductive base structure down to a surface of at least one of the one or more isolation structures after bonding the first dielectric structure of the first memory device structure to the second dielectric structure of the second memory device structure; and forming control logic circuitry over and in electrical communication with the source structure after bonding the first dielectric structure of the first memory device structure to the second dielectric structure of the second memory device structure.

11. The method of claim 10, wherein bonding the first dielectric structure of the first memory device structure to the second dielectric structure of the second memory device structure comprises:

vertically inverting the first memory device structure;

providing the vertically inverted first memory device structure over the second memory device structure; and bonding the first dielectric structure of the vertically inverted first memory device structure to the second dielectric structure of the second memory device structure to form a connected dielectric structure.

12. The method of claim 10, wherein forming control logic circuitry over and in electrical communication with the source structure:

forming transistors at least partially overlying a remaining portion of the semiconductive base after removing the portion of the semiconductive base structure down to the surface of the at least one of the one or more isolation structures; and forming conductive routing structures vertically over the transistors, the conductive routing structures coupled to the transistors by way of first conductive contact structures, and the conductive routing structures coupled the source structure by way of at least one second conductive contact structure vertically extending through the at least one of the one or more isolation structures.

13. The method of claim 10, wherein forming control logic circuitry over and in electrical communication with the source structure comprises forming CMOS circuitry over and in electrical communication with the source structure.

* * * * *